United States Patent
Lin et al.

(10) Patent No.: US 7,719,882 B2
(45) Date of Patent: May 18, 2010

(54) ADVANCED MRAM DESIGN

(75) Inventors: Wen-Chin Lin, Hsin-Chu (TW);
Hsu-Chen Cheng, Hsinchu (TW);
Yu-Jen Wang, Hsinchu (TW); Denny Tang, Saratoga, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 102 days.

(21) Appl. No.: 11/743,453

(22) Filed: May 2, 2007

(65) Prior Publication Data
US 2008/0186757 A1 Aug. 7, 2008

Related U.S. Application Data

(60) Provisional application No. 60/888,490, filed on Feb. 6, 2007.

(51) Int. Cl.
*G11C 11/00* (2006.01)
(52) U.S. Cl. .................. 365/158; 365/171; 365/173; 365/230.03
(58) Field of Classification Search .............. 365/158, 365/171, 173, 230.03
See application file for complete search history.

(56) References Cited

U.S. PATENT DOCUMENTS

| | | | | |
|---|---|---|---|---|
| 5,778,436 | A * | 7/1998 | Kedem et al. | 711/137 |
| 6,418,046 | B1 * | 7/2002 | Naji | 365/158 |
| 6,483,740 | B1 * | 11/2002 | Spitzer et al. | 365/158 |
| 6,545,906 | B1 * | 4/2003 | Savtchenko et al. | 365/158 |
| 7,023,726 | B1 * | 4/2006 | Chen et al. | 365/158 |
| 2004/0037152 | A1 * | 2/2004 | Ooishi | 365/230.03 |
| 2005/0243598 | A1 * | 11/2005 | Lin et al. | 365/158 |

OTHER PUBLICATIONS

Debrosse et al. "A High-Speed 128-kb MRAM Core for Future Universal Memory Applications" IEEE Journal of Solid-State Circuits, vol. 39, No. 4, Apr. 2004, pp. 678-683.*

* cited by examiner

*Primary Examiner*—Tuan T Nguyen
*Assistant Examiner*—R Lance Reidlinger
(74) *Attorney, Agent, or Firm*—Baker & McKenzie LLP

(57) ABSTRACT

Disclosed herein is a technique for created an advanced MRAM array for constructing a memory integrated circuit chip. More specifically, the disclosed principles provide for an integrated circuit memory chip comprised of a combination of at least one of an array of high-speed magnetic memory cells, and at least one of an array of high-density magnetic memory cells. Accordingly, a memory chip constructed as disclosed herein provides the benefit of both high-speed and high-density memory cells on the same memory chip. As a result, applications benefiting from the use of (or perhaps even needing) high-speed memory cells are provided by the memory cells in the high-speed memory cell array.

9 Claims, 17 Drawing Sheets

ADVANCED MRAM DESIGN

RELATED APPLICATIONS

This disclosure claims priority to U.S. Provisional Patent Application No. 60/888,490 filed Feb. 6, 2007, and is incorporated herein by reference in its entirety. This disclosure is also related to the following commonly-assigned U.S. patent applications, the entire disclosures of which are hereby incorporated herein by reference for all purposes:

"MRAM ARRAYS AND METHODS FOR WRITING AND READING MAGNETIC MEMORY DEVICES," application Ser. No. 11/115,422, filed Apr. 27, 2005, having Wen Chin Lin named as inventor.

"MULTI-SENSING LEVEL MRAM STRUCTURES," application Ser. No. 10/685,824, filed Oct. 13, 2003, having Wen Chin Lin and Denny D. Tang named as inventors.

"MULTI-SENSING LEVEL MRAM STRUCTURE WITH DIFFERENT MAGNETORESISTANCE RATIOS," application Ser. No. 10/678,699, filed Oct. 3, 2003, having Wen Chin Lin and Denny D. Tang named as inventors.

"NON-ORTHOGONAL WRITE LINE STRUCTURE IN MRAM," application Ser. No. 10/827,079, filed Apr. 19, 2004, having Wen Chin Lin, Denny D. Tang and Li Shyue Lai named as inventors.

"MRAM CELL WITH REDUCED WRITE CURRENT," 11/030,453, filed Jan. 6, 2005, having Wen Chin Lin, Denny D. Tang and Li-Shyue Lai named a inventors.

TECHNICAL FIELD

Disclosed embodiments herein relate generally to magnetic random access memory (MRAM) devices, and more particularly to MRAM memory arrays providing for optimized speeds and minimal areas using improved magnetic tunnel junction (MTJ) materials, processes, and circuits.

BACKGROUND

An MTJ memory device comprises three basic layers, a free ferromagnetic layer, an insulating tunneling barrier, and a pinned ferromagnetic layer. The magnetization moments of the free ferromagnetic layer are free to rotate under an external magnetic field. The pinned ferromagnetic layer can comprise a ferromagnetic layer and/or an anti-ferromagnetic layer that pins the magnetic moments in the ferromagnetic layer. Thus, the magnetization moment of the pinned ferromagnetic layer is pinned in a fixed direction. A very thin insulation layer forms the tunneling barrier between the pinned and free ferromagnetic layers.

The MTJ memory device can be electrically represented as a resistor. The size of the resistance depends upon the orientation of the magnetization of the free ferromagnetic layer and the pinned ferromagnetic layer. As is understood by those skilled in the art, the MTJ memory device has a relatively high resistance when the magnetic vectors are misaligned (point in opposite directions) and a relatively low resistance when the magnetic vectors are aligned. That is, an MTJ memory device stores a bit of information as the relative orientation of the magnetizations of the free ferromagnetic layer and the pinned ferromagnetic layer. In other words, the magnetization of each MTJ memory device at any given time assumes one of two stable orientations. These two stable orientations, referred to as "parallel" and "anti-parallel" magnetic orientation, represent logic values of "0" and "1", for example.

To write or change the state in a basic MTJ memory device, an external magnetic field can be applied that is sufficient to completely switch the stable orientation of the magnetization of the free ferromagnetic layer. To sense states in the MTJ memory device, a read current can be applied through the MTJ memory device. As the magneto-resistance varies according to the state stored in the MTJ memory device, the logic state of the MTJ memory device can be sensed by obtaining the voltage difference across the MTJ memory device. An MRAM array comprises a plurality of MTJ memory devices, and the binary logic data of entire MRAM array is typically read by applying a sensing current flowing perpendicularly through selected MTJ memory device. Switches, typically transistors like MOSFETs, are implemented in conventional methods to block the stray read current path. In addition, the switches are also used to avoid write disturbance.

Some MRAM circuit arrays employ one transistor for each bit (each memory cell or bit is thus noted as 1T1R) to control the read current and block the sneak current paths. This type of MRAM array typically offers fast memory speeds, such as used in L1 cache memory. However, the one-to-one ratio of switches to MTJ stacks in such arrays limits array density. Other array layouts employ two transistors for each MTJ stack (noted as 2T1R). However, although this design provides very fast speeds, such designs provide insufficient cell density due to the relatively large area occupied by the switching devices in relation to MTJ stacks. Still other array layouts employ one transistor for two or more MTJ stacks (noted as 1T2R, or 1TnR for "n" number of MTJ stacks per switching device). However, while these layouts provide for increased MRAM cell density per chip real estate, they typically lack the desired fast access speeds demanded in today's market. As can be seen, available MRAM array layouts result in a give-and-take for various applications. Accordingly, a new type of array layout for memory cell arrays such as MRAM devices is needed.

BRIEF SUMMARY

Disclosed herein is a technique for created an advanced MRAM array for constructing a memory integrated circuit chip. More specifically, the disclosed principles provide for an integrated circuit memory chip comprised of a combination of at least one of an array of high-speed magnetic memory cells, and at least one of an array of high-density magnetic memory cells. Accordingly, a memory chip constructed as disclosed herein provides the benefit of both high-speed and high-density memory cells on the same memory chip. As a result, applications benefiting from the use of (or perhaps even needing) high-speed memory cells are provided by the memory cells in the high-speed memory cell array.

In one embodiment, an integrated circuit memory chip comprises a first memory cell array comprising an array of high-speed magnetic memory cells, and a second memory cell array adjacent to the first memory cell array, the second memory cell array comprising an array of high-density magnetic memory cells.

In another embodiment, an integrated circuit memory chip comprises a first memory cell array comprising an array of high-speed magnetic memory cells, wherein each of the high-speed magnetic memory cells comprises one switching device for one magnetoresistive stack. In addition, this memory chip comprises a second memory cell array adjacent to the first memory cell array, the second memory cell array comprising an array of high-density magnetic memory cells, wherein each of the high-density magnetic memory cells comprises one switching device per at least two magnetoresistive stacks. Furthermore, in such an embodiment, the memory chip may further comprise first array logic for use with the magnetic memory cells in the high-speed memory array, and second control logic for use with the magnetic memory cells in the high-density memory array, Then, such a chip may include a first set of conductive lines interfacing the first array logic with the high-speed memory array, and a second set of conductive lines interfacing the second array logic with the high-density memory array.

In another embodiment, an integrated circuit memory chip comprises a first memory cell array comprising an array of high-speed magnetic memory cells, wherein each of the high-speed magnetic memory cells comprises at least one switching device per one magnetoresistive stack. Also, such a memory chip comprises a second memory cell array adjacent to the first memory cell array, the second memory cell array comprising an array of high-density magnetic memory cells, wherein each of the high-density magnetic memory cells comprises one switching device per at least two magnetoresistive stacks. In addition, the memory chip may include array logic for use with the magnetic memory cells in the high-speed memory array and with the magnetic memory cells in the high-density memory array. In some embodiments, the memory chip can then include a first set of conductive lines interfacing the array logic with the high-speed memory array, and a second set of conductive lines interfacing the array logic with the high-density memory array.

BRIEF DESCRIPTION OF THE DRAWINGS

For a more complete understanding of this disclosure, and the advantages of the systems and methods herein, reference is now made to the following descriptions taken in conjunction with the accompanying drawings, in which.

DETAILED DESCRIPTION

Figure 1:
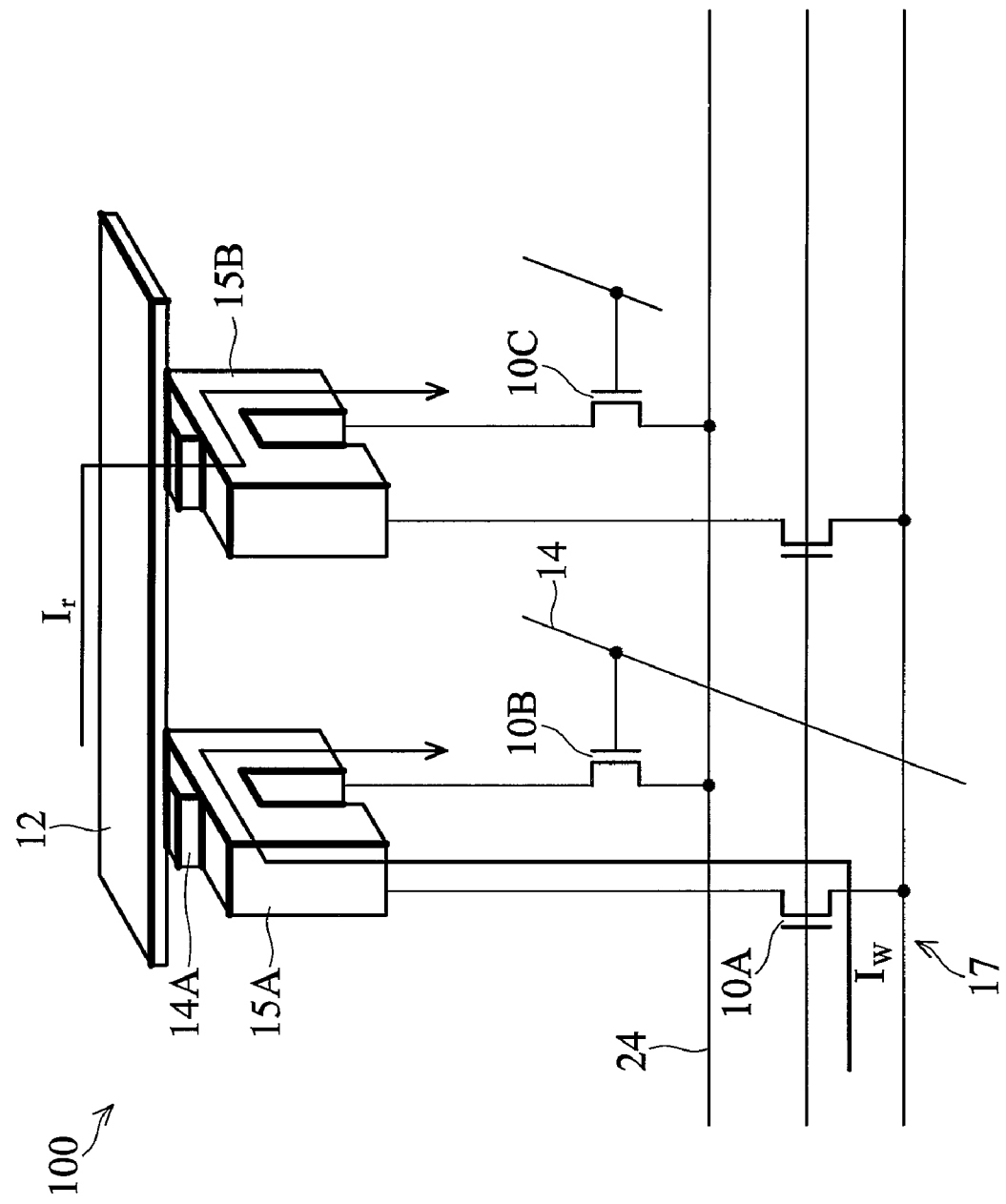
FIG. 1 illustrates an MRAM array layout using 2T1R memory cells.

It is to be understood that the following disclosure provides many different embodiments or examples. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 shows the structure of the 2T1R MRAM cell 100 disclosed in U.S. Pat. No. 6,606,263 to Tang. To write data to memory element 14A, switches 10A and 10B are selected, and the magnetic field generated by write current $I_W$ through program line 15A switches the direction of the magnetic moments of the free ferromagnetic layer of memory element 14A. When switch 10C is selected, read current $I_T$ flows through bit line 12, memory element 14B, program line 15A, and switch 10C. Thus, data stored in memory element 14B is obtained by sensing the voltage level of bit line 12. While the cell structure in FIG. 1 effectively eliminates write disturbance, the cell density of the MRAM structure in FIG. 1 is poor.

Figure 2:
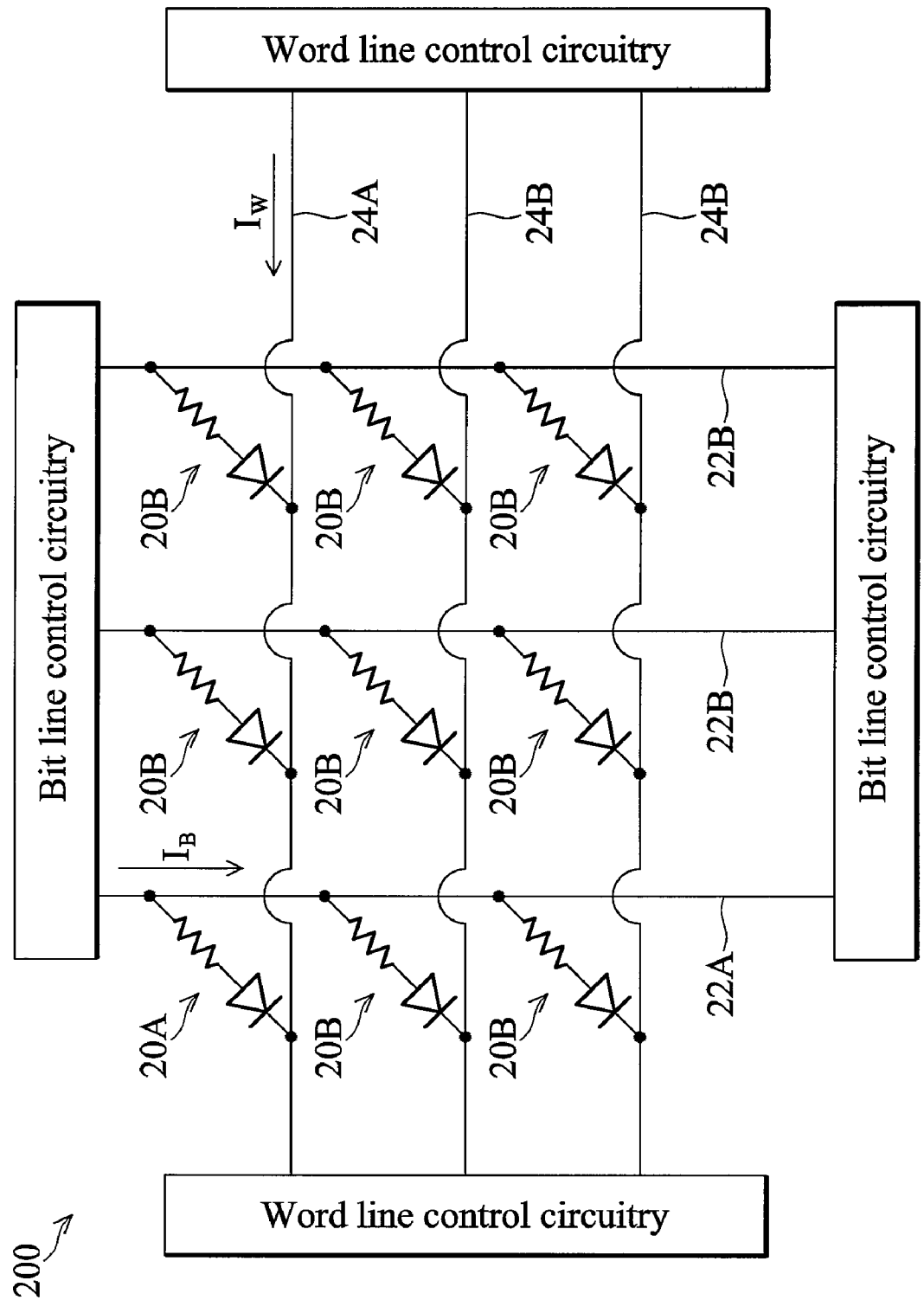
FIG. 2 illustrates an MRAM array layout using 1T1R memory cells.

FIG. 2 shows the circuit 200 disclosed in U.S. Pat. No. 5,640,343 to Gallagher, which uses one switch for one bit (1T1R) to control the sense current and block all stray paths. A selected cell 20A is written by passing current $I_B$ through bit line 22A, and current $I_W$ through word line 24A. According to the "astroid curve," the magnetic field produced by either $I_B$ or $I_W$ alone in the region of the cells is less than the magnetic field required to change the magnetic state in a cell, thus, half-selected cells 20B (those over which only $I_B$ or $I_W$ alone is passing) are not written. The combination of magnetic fields from $I_B$ and $I_W$ is, however, sufficient to change the state of selected memory cell 20A.

In a read operation, a forward bias voltage is established across the selected cell 20A by pulling the word line 24 voltage down, and raising the bit line 22 voltage. In addition, unselected bit lines 24B and word lines 22B remain at standby voltages, thus, half-selected cells have a zero voltage drop from word line to bit line and do not conduct. The data stored in selected cell 20A is obtained by sensing the resistance thereof. The resistance of the selected cell determines the sense current that flows from the selected bit line to the selected word line through the selected memory cell. As mentioned above, this type of one-to-one ratio, therefore, provides for the fast access speeds desired in MRAM arrays.

Figure 3:
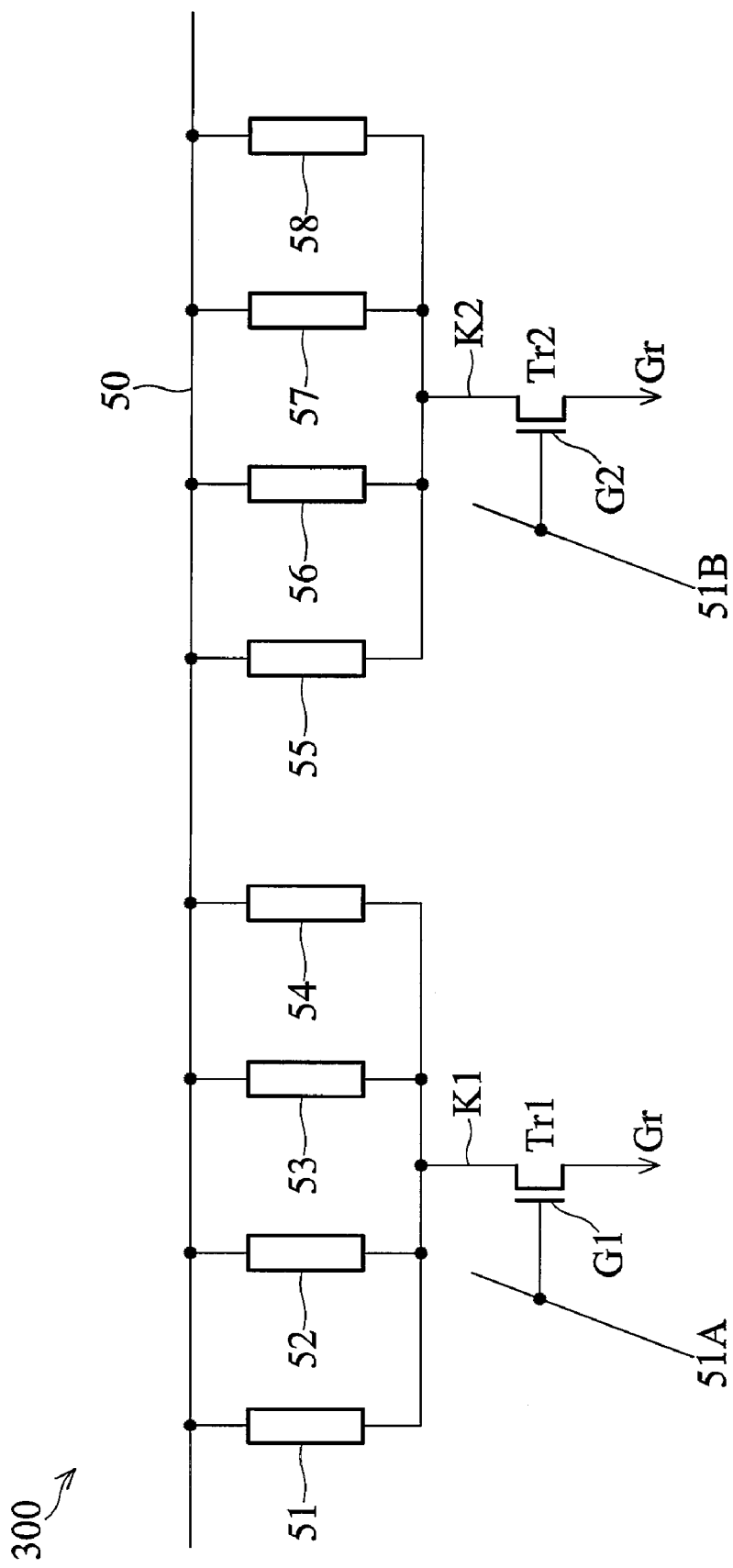
FIG. 3 illustrates an MRAM array layout using 2TnR memory cells.

FIG. 3 illustrates the circuit 300 disclosed in U.S. Pat. No. 6,421,271 to Gogl, which uses one switching device for multiple MTJ stacks (1TnR). The circuit 300 comprises bit line 50 and word lines 51A and 51B crossing bit line 50 essentially perpendicularly, at a distance from one another. MTJ memory devices 51-54 are located between bit line 50 and word line 51A, and MTJ memory devices 55-58 are located between bit line 50 and word line 51B. The ends situated opposite bit line 50 of the memory cells 51-54 are connected with a drain or source of a switching transistor Tr1, while the ends situated opposite bit line 50 of memory cells 55-58 are connected to a drain or source of a switching transistor Tr2. A gate of transistor Tr1 is connected to word line 51A, and a gate of transistor Tr2 is connected to word line 51B. The source or drain of the switching transistors Tr1 and Tr2 are grounded.

During a read process, a predetermined voltage of 1V to 2V is applied to bit line 50. The transistors of all the word lines, except for the transistors of a particular word line, are thereby blocked. It is assumed here that in the example the transistors of word line WL1 conduct, i.e., in the example, transistor Tr1 is supposed to be turned ON. If now, for example, the MTJ memory device 52 is in a low-ohmic state (parallel magnetization of the two magnetic layers), while the remaining MTJ memory devices 51, 53 and 54 are in a high-ohmic state (anti-parallel magnetization of the magnetic layers), on word line 51A a corresponding signal is obtained that differs from the signal that is present on word line when all the TMR memory cells are in a high-ohmic state. In order to determine which of the memory cells 51-54 is in the low-ohmic state, a self-reference sensing scheme is implemented. Thus, while this type of memory cell array provides for increased cell density on a memory chip, the access speed for the array is reduced because of the heavy MTJ stack-to-switch ratio.

Figure 4:
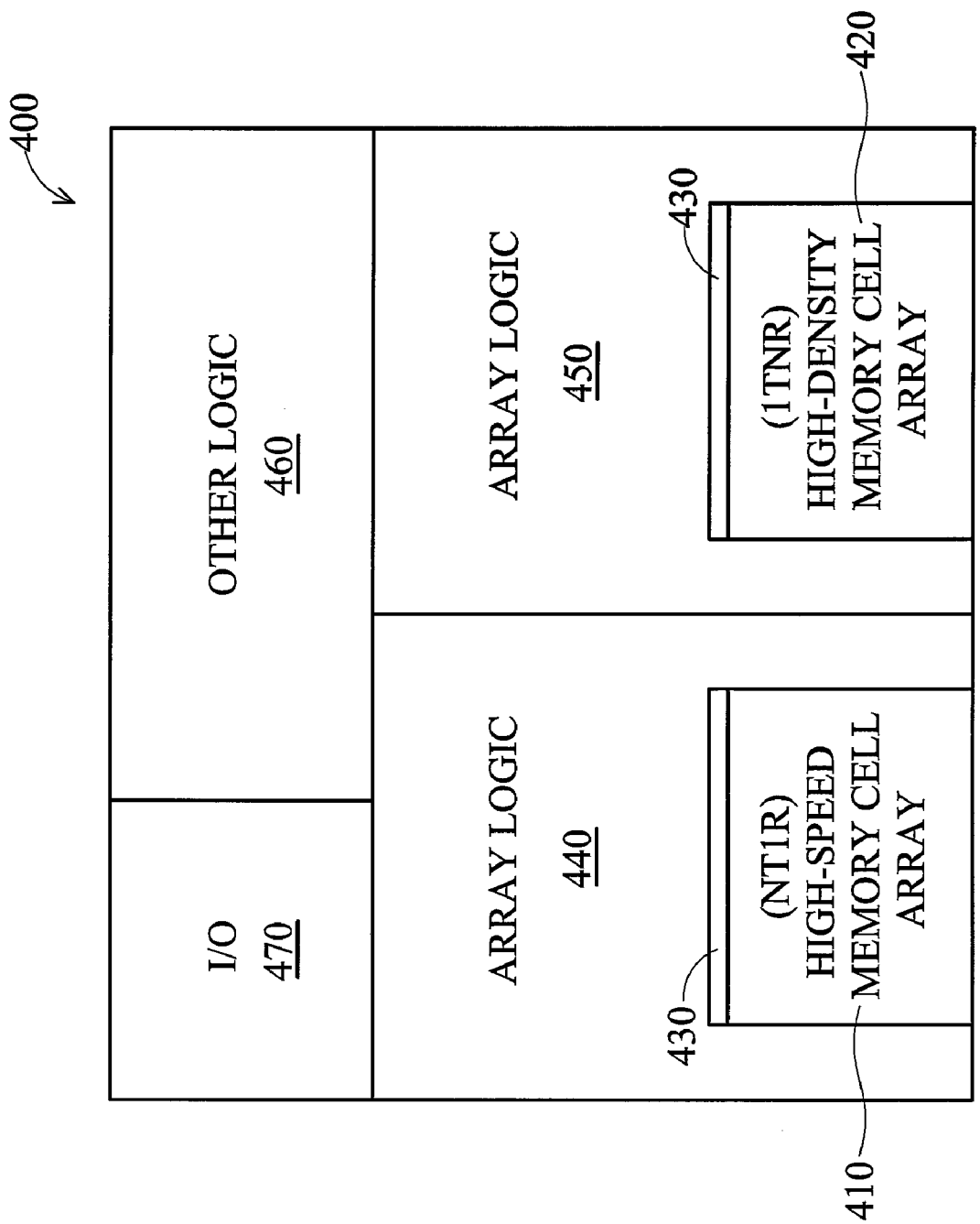
FIG. 4 illustrates a high level block diagram of one embodiment of an integrated circuit memory chip that is one example of a circuit that can benefit from aspects of the disclosed principles.

FIG. 4 illustrates a high level block diagram of one embodiment of an integrated circuit memory chip 400 that is one example of a circuit that can benefit from aspects of the disclosed principles. In accordance with the disclosed principles, the integrated memory chip 400 includes two memory cell arrays 410, 420, such as MRAM device arrays. More precisely, a first memory cell array 410 comprises an array of high-speed memory cells, such as NT1R memory cells, while a second memory cell array 420 comprises an array of high-density memory cells, such as 1TNR memory cells. Moreover, the MRAM devices may comprise any type of MRAM device, either now existing or later developed, including newer devices such as toggle-mode devices.

As used herein, a "high-speed memory array" means a memory cell array wherein the ratio of switching devices to memory devices is N:x (i.e., NTxR, where "N" is 2 or greater and "x" is 1 or greater, or wherein two or more switching devices are employed per memory device (e.g., MTJ stack) or group of memory devices (e.g., 2T1R, 2T4R, etc.). A "high-density memory array" means a memory cell array comprised of a ratio of 1:2 or less of switching devices to memory devices (i.e., 1TNR, where "N" is 2 or greater). In exemplary embodiments, the high-speed memory cell array 410 may comprise an array 410 of 1T1R memory cells, while the high-density memory cell array 420 may comprise an array 420 of 1T2R memory cells. In other embodiments, the high-speed memory cell array 410 may comprise an array 410 of 2T1R memory cells, while the high-density memory cell array 420 may comprise an array 420 of 1T4R memory cells.

In accordance with the disclosed principles, the high-speed array 410 and high-density array 420 can be separately controlled by corresponding array logic 440, 450 through an interface 430. It is well known in the art that various logic circuitry, such as row and column decoders and sense amplifiers, can be included in the typical array logic that is used to read/write to memory cells in a memory cell array. However, the novel memory chip 400 may include two distinct array logic circuits 440, 450 used to read/write to memory cells in the corresponding high-speed array 410 and high-density array 420, other embodiments of the chip 400 may employ the same array logic for use with both the high-speed and high-density arrays.

The interface 430 for each array 410, 420 may include one or more bit lines, gate lines, digit lines, control lines, word lines, and other communication paths to interconnect the high-speed array 410 and high-density array 420 with their corresponding array logic 440, 450. These communication paths may hereinafter be referred to as bit lines, word lines, programming lines, and variations thereof, it being understood that different applications of the present disclosure may use different communication paths. The memory chip 400 can further include other logic 460, such as counters, clock circuits, and processing circuits. In addition, the memory chip 400 may also include input/output circuitry 470, such as buffers and drivers, to interconnect the memory chip 400 with neighboring circuits and components.

In accordance with the above, the disclosed principles provide for an integrated circuit memory chip 400 comprised of a combination of at least one of an array of high-speed magnetic memory cells, and at least one of an array of high-density magnetic memory cells. Accordingly, a memory chip 400 constructed as disclosed herein provides the benefit of both high-speed and high-density memory cells on the same memory chip 400. As a result, applications benefiting from the use of (or perhaps even needing) high-speed memory cells are provided by the memory cells in the high-speed memory cell array 410. Examples of such memory application include cache memory, buffer memory (e.g., the buffer memory in the Telecom System Line Interface Memory Card, and high-speed memory in embedded processor applications. Applications requiring a much lager number of memory cells, where access speed is not as critical, are provided simultaneously by the memory cells in the high-density memory cell array 420. Examples of such memory applications include data or code storage, such as pictures, music, or data files, similar to modern Flash memory.

What follows is a discussion of several exemplary memory array layouts that can be used for the high-speed array 410 and high-density array 420, as defined herein. Of course, the present disclosure is not limited to these advantageous embodiments. Moreover, it should be understood that based on the selected the high-speed array 410 and high-density array 420 for use in the memory chip 400, the corresponding array logic 440, 450 for each such array 410, 420 should be selected to advantageously operated the corresponding array 410, 420. As a result, while some implementations will result in distinct bit lines, word lines, and program lines in the array logic 440, 450 for each memory array 410, 420, some combinations of arrays 410, 420 may result in a single array logic circuit for the reading/writing of both the high-speed array 410 and high-density array 420. In such embodiments, the array logic 440, 450 may be configured such that certain bit lines, word lines, and program lines are shared between the high-speed array 410 and high-density array 420, as is appropriate. Those who are skilled in the art will understand the array logic needed to operate selected memory arrays 410, 420, as well as how that array logic is manufactured and integrated on the memory chip 400.

Exemplary High-Speed Memory Array Layouts

Figure 5:
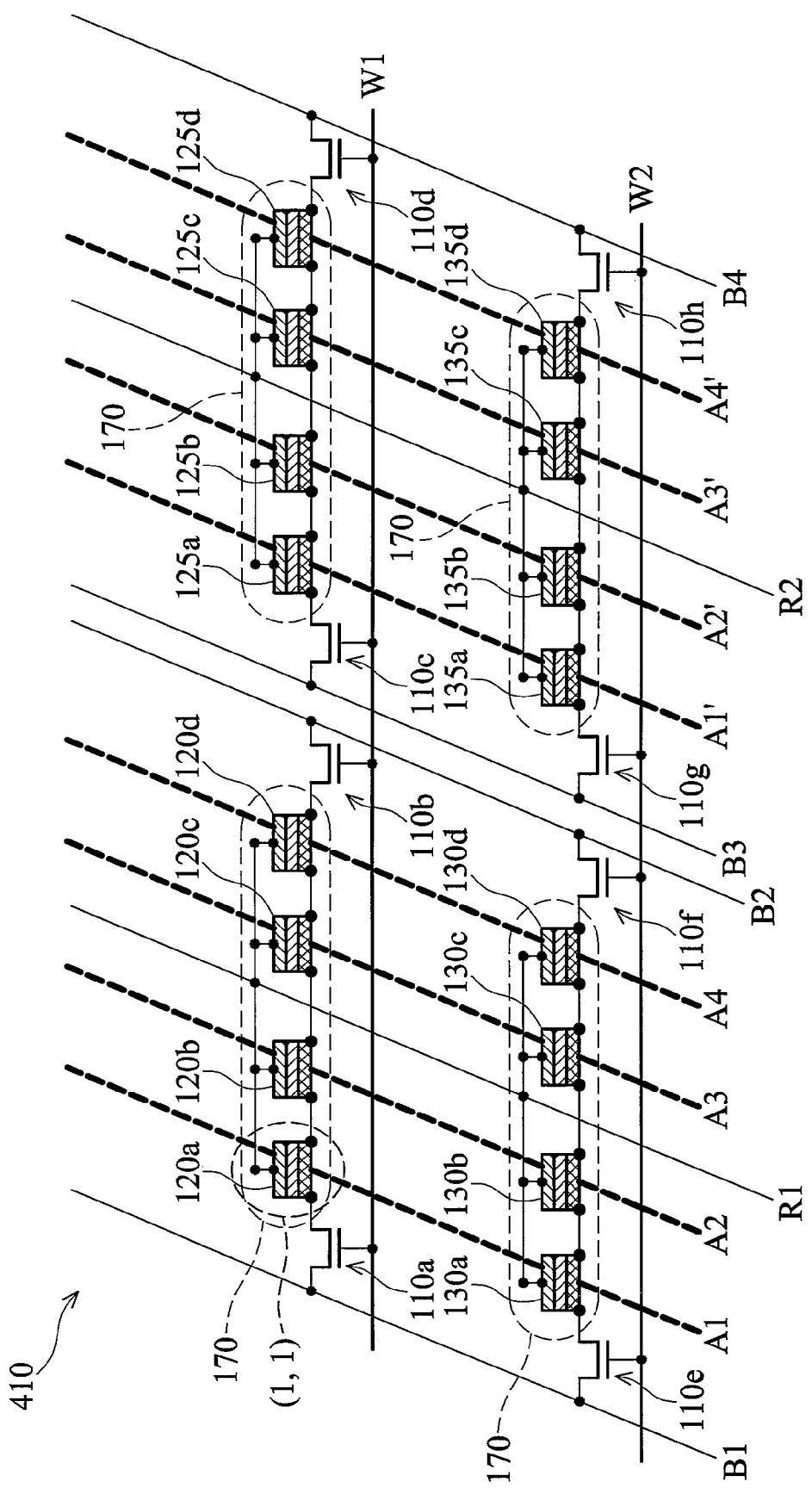
FIGS. 5 through 13 illustrate exemplary embodiments of high-speed MRAM memory array layouts that be employed in the high-speed array of a memory chip constructed as disclosed herein.

FIG. 5 illustrates a circuit diagram of a portion of a 2T4R memory array 410 that may be incorporated into an array layout according to the disclosed principles. The illustrated portion of the array 410 includes word lines W1, W2, bit lines B1-B4, conductive lines A1-A4 and A1'-A4', read lines R1, R2, switches 110a-110h, and MTJ stacks 120a-120d, 125a-125d, 130a-130d, 135a-135d. Each of the MTJ stacks 120a-120d, 125a-125d, 130a-130d, 135a-135d maybe a portion of a memory cell, such as memory cell (1,1). Of course, the array 410 may comprise many cells in addition to those shown in FIG. 8. The MTJ stacks 120a-120d, 125a-125d, 130a-130d, 135a-135d may each comprise a free layer located near or adjacent a programming line, a tunneling barrier layer adjacent the free layer, and a pinned layer located adjacent the tunneling barrier layer and distal from the write line. However, in other embodiments, the locations of the free layer and the pinned layer may be switched. The MTJ stack 120a-120d, 125a-125d, 130a-130d, 135a-135d each also have a long axis, which may be referred to as an easy axis, and a short axis, which may be referred to as a hard axis.

FIGS. 6-17 illustrate various embodiments of memory cell layouts that may be employed in a memory cell array according to the disclosed principles. Unlike the array 410 illustrated in FIG. 5, the segmented units (e.g., 170 in FIG. 5) have been redrawn in these figures in a simplified format. Each of the segmented units 170 includes a number "N" of MTJ stacks which are connected in parallel, where the number N may be any integer greater than one.

Figure 6:
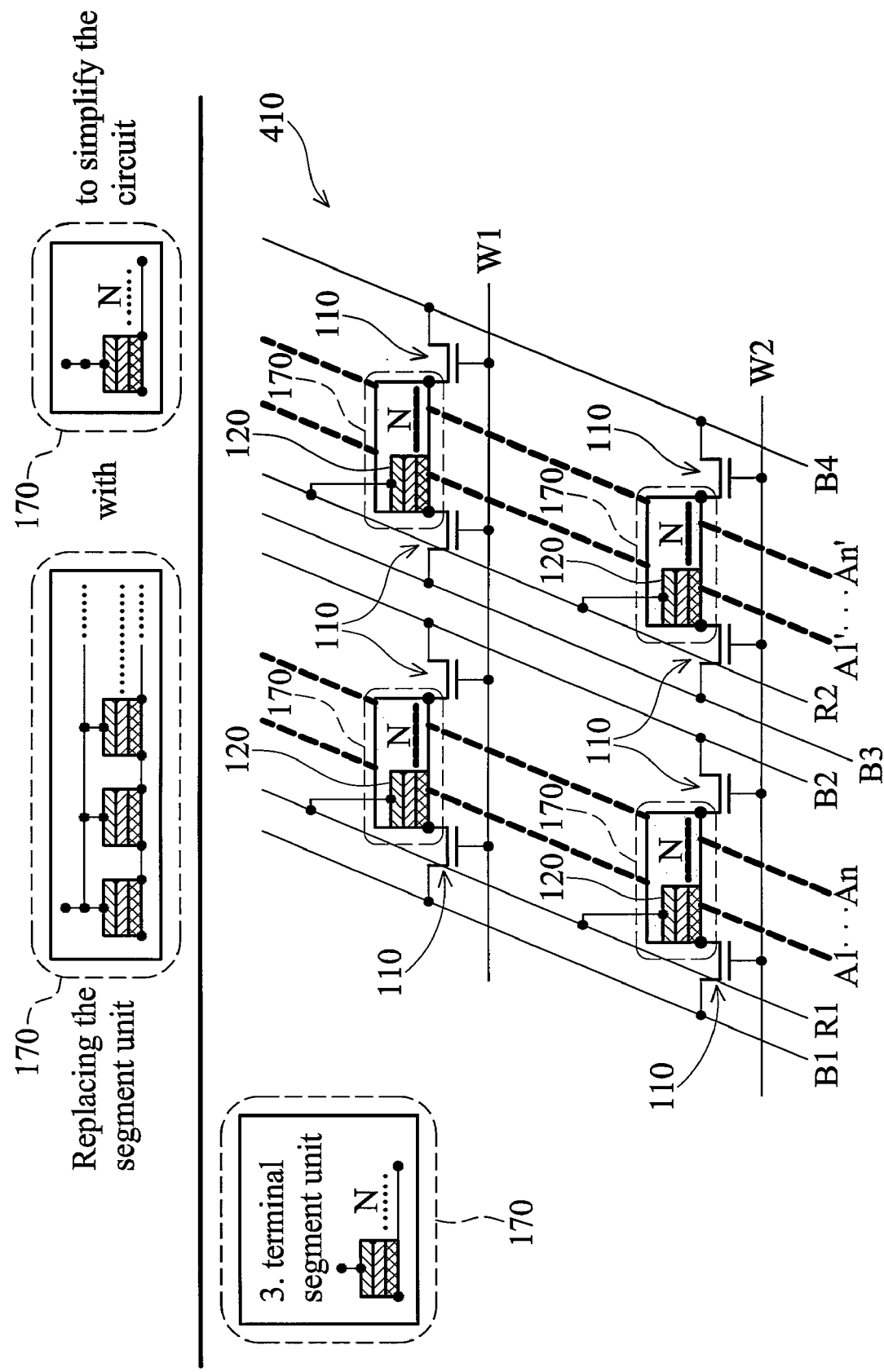

In the layout 410 of FIG. 6, each of the MTJ stacks 120 within a segmented unit 170 may be connected in series by a write line. Each of the MTJ stacks 120 may also be proximate but electrically isolated from a corresponding one of write lines A1-An, A1'-An', wherein the number of write lines A1-An (i.e., the number "n") is the same as the number N of MTJ stacks 120 in each segmented unit 170. Also for each segmented unit 170, one terminal is connected to a corresponding one of the read lines R1, R2, another terminal is connected to a bit line (e.g., B1 or B3) through a switch 110, and another terminal is connected to another bit line (e.g., B2 or B4) through another switch 110.

Figure 7:
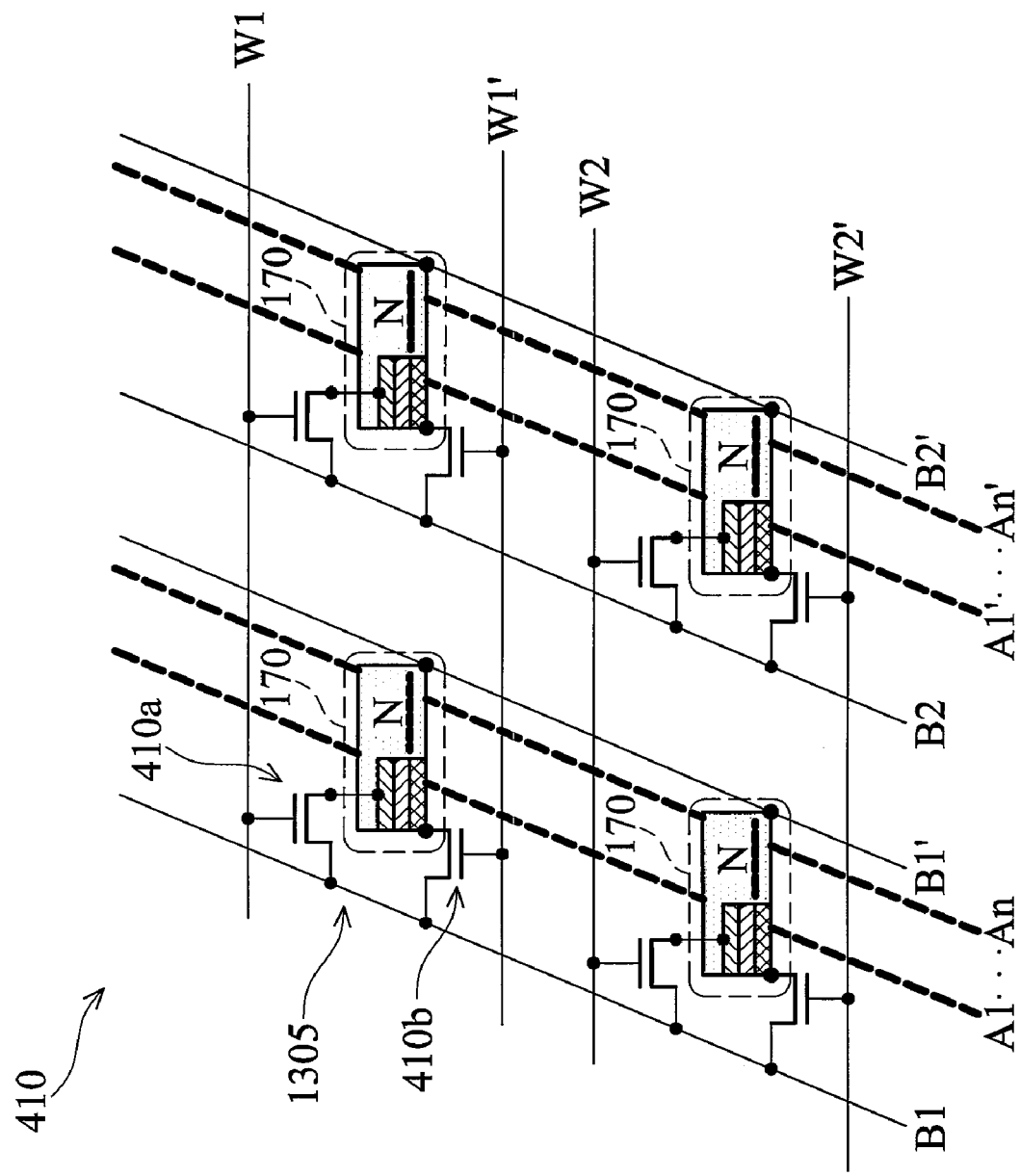

The array 410 in FIG. 7 includes bit lines B1, B2, word lines W1, W2, and conductive lines A1-An, A1'-An'. However, the array 410 also includes bit-bar lines B1', B2' and word-bar lines W1', W2', among others. The array 410 also includes segmented units 170 each having a terminal connected to one of a bit line and a bit-bar line through a switch, another terminal connected to the same bit line or bit-bar line through another switch, and another terminal connected to one of another pair of bit/bit-bar lines. For example, a cell 1305 in the array 410 may include a segmented unit 170 having a terminal connected to bit line B1 through a switch 1310a, wherein the gate of the switch 1310a may be connected to word line W1. Another terminal of the segmented unit 170 in cell 1305 may be connected to bit line B1 through a switch 1310b, wherein the gate of the switch 1310b may be connected to word-bar line W1'. Another terminal of the segmented unit 170 in cell 1305 may be connected to bit-bar line B1'.

Figure 8:
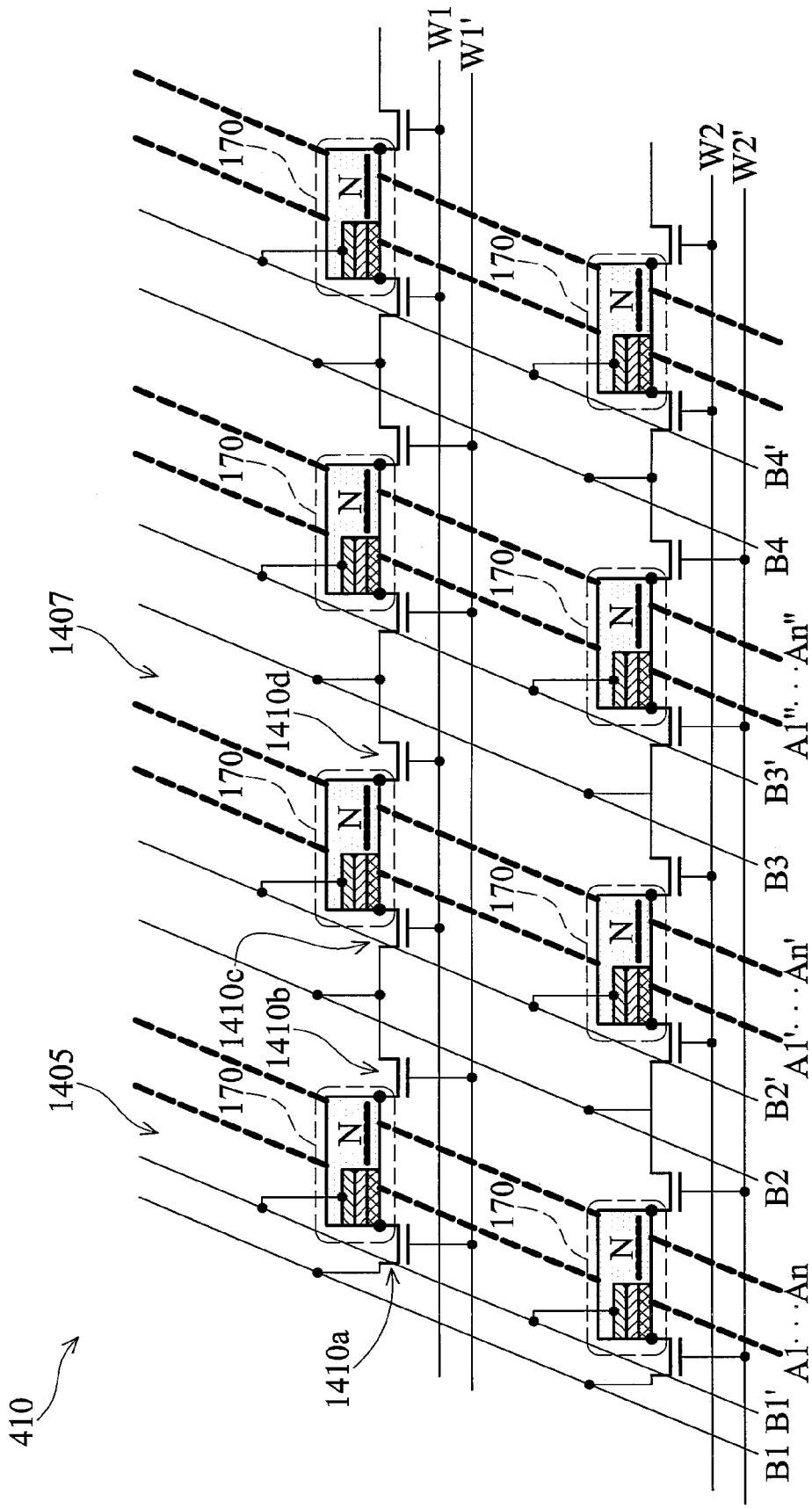

The array 410 shown in FIG. 8 includes bit lines B1-B4, word lines W1, W2, and conductive lines A1-An, A1'-An'. However, the array 410 also includes bit-bar lines B1'-B4', word-bar lines W1', W2', and conductive lines A1"-An", among others. The array 410 also includes segmented units 170 each having a terminal connected to one of a bit line and a bit-bar line, another terminal connected to the other of the bit line and the bit-bar line through a switch, and another terminal connected to another bit line or bit-bar line through another switch. For example, a cell 1405 in the array 410 may include a segmented unit 170 having a terminal connected to bit-bar line B1'. Another terminal of the segmented unit 170 in cell 1405 may be connected to bit line B1 through a switch 410a, wherein the gate of the switch 410a may be connected to word-bar line W1'. Another terminal of the segmented unit 170 in cell 1405 may be connected to bit line B2 through another switch 410b, wherein the gate of the switch 410b maybe connected to word-bar line W1'. Another cell 1407 in the array 410 may include a segmented unit 170 having a terminal connected to bit-bar line B2'. Another terminal of the segmented unit 170 in cell 1407 may be connected to bit line B2 through a switch 410c, wherein the gate of the switch 410c maybe connected to word line W1. Another terminal of the segmented unit 170 in cell 1407 maybe connected to bit line B3 through another switch 410d, wherein the gate of the switch 410d may be connected to word line W1.

Figure 9:
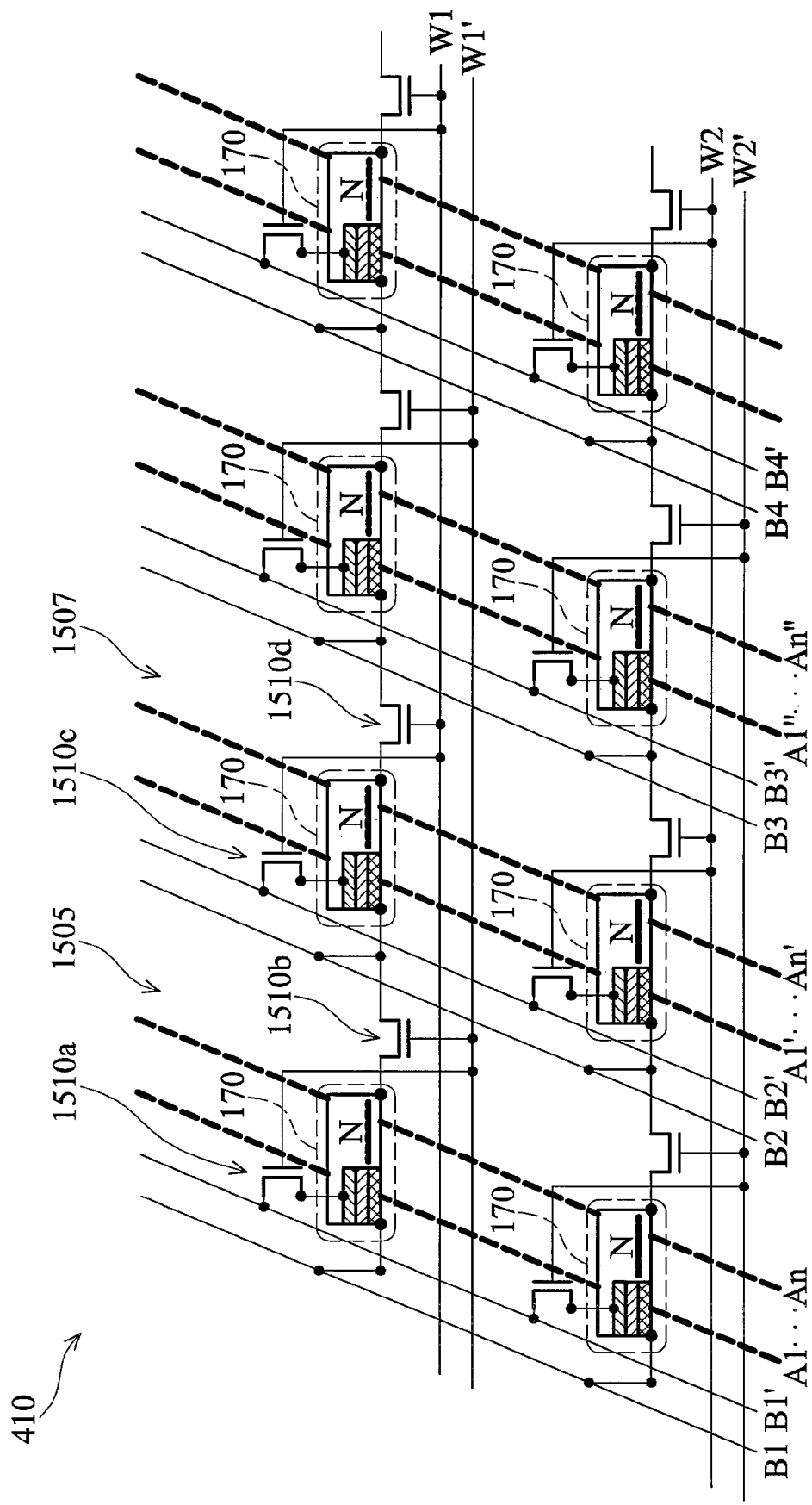

The array 410 in FIG. 9 includes bit lines B1-B4, B1'-B4', word lines W1, W2, W1', W2', and conductive lines A1-An, A1'-An', A1"-An", among others. The array 410 also includes segmented units 170 each having a terminal connected to one of a bit line and a bit-bar line through a switch, another terminal connected to the other of the bit line and the bit-bar line, and another terminal connected to another bit line or bit-bar line through another switch. For example, a cell 1505 in the array 410 may include a segmented unit 170 having a terminal connected to bit-bar line B1' through a switch 1510a, wherein the gate of the switch 1510a maybe connected to word-bar line W1'. Another terminal of the segmented unit 170 in cell 1505 may be connected to bit line B1. Another terminal of the segmented unit 170 in cell 1505 may be connected to bit line B2 through another switch 1510b, wherein the gate of the switch 1510b may be connected to word-bar line W1'. Another cell 1507 in the array 410 may include a segmented unit 170 having a terminal connected to bit-bar line B2' through a switch 1510c, wherein the gate of the switch 1510c maybe connected to word line W1. Another terminal of the segmented unit 170 in cell 1507 may be connected to bit line B2. Another terminal of the segmented unit 170 in cell 1507 may be connected to bit line B3 through another switch 1510d, wherein the gate of the switch 1510d may be connected to word line W1.

Figure 10:
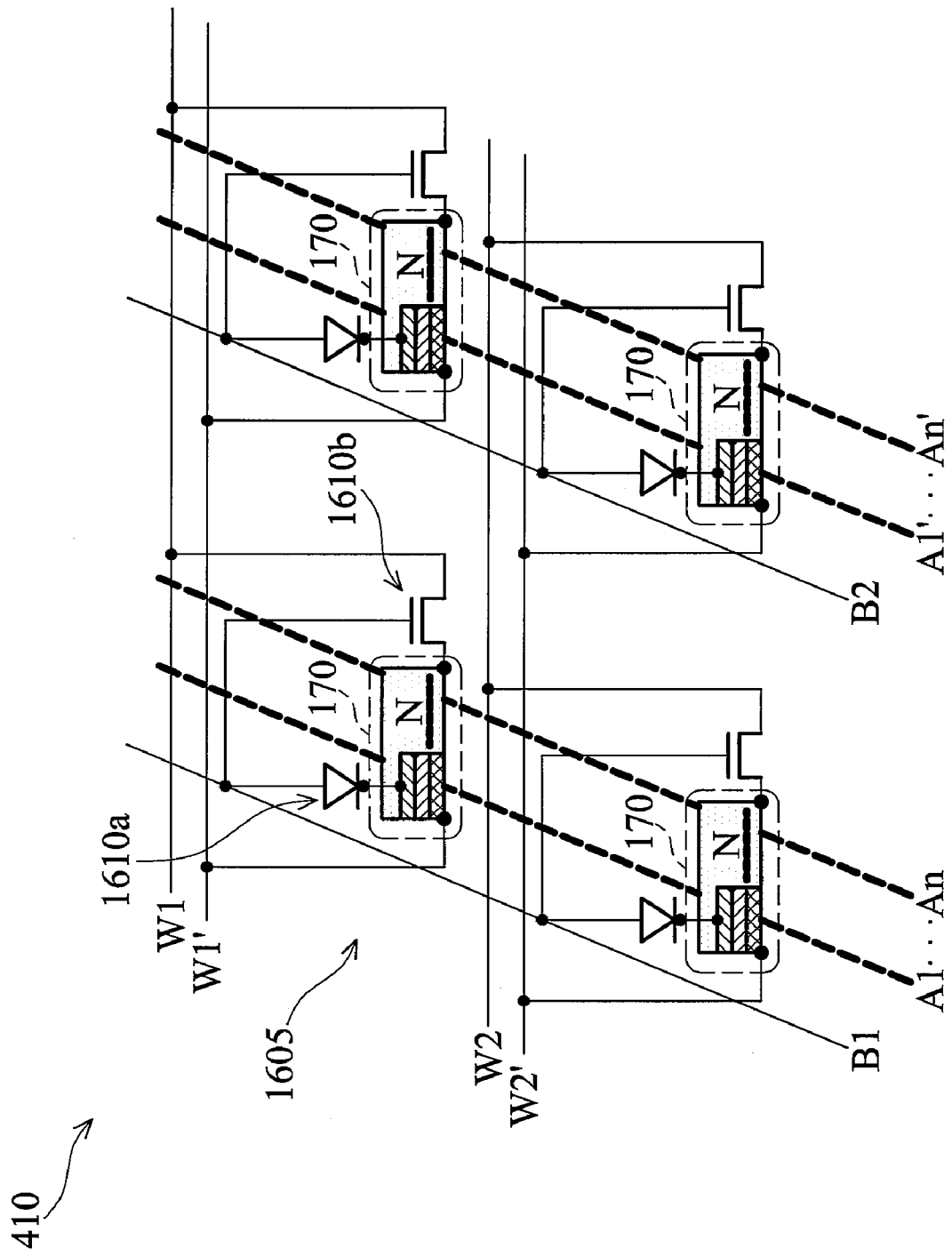

The array 410 in FIG. 10 includes bit lines B1, B2, word lines W1, W2, W1', W2', and conductive lines A1-An, A1'-An' among others. The array 410 also includes segmented units 170 each having a terminal connected to bit line through a switch, another terminal connected to one of a word line and a word-bar line, and another terminal connected to the other of the word line and word-bar line through another switch. However, several of the switches in the array 410 may be diodes or bipolar-junction transistors (BJTs) instead of (or in addition to) transistors. For example, a cell 1605 in the array 410 may include a segmented unit 170 having a terminal connected to bit line B1 through a switch 1610a, wherein the switch 1610a may be or comprise a diode or BJT. Another terminal of the segmented unit 170 in cell 1605 may be connected to word-bar line W1'. Another terminal of the segmented unit 170 in cell 1605 may be connected to word line W1 through another switch 1610b, wherein the switch 1610b is a transistor having a gate that may be connected to bit line B1.

Figure 11:
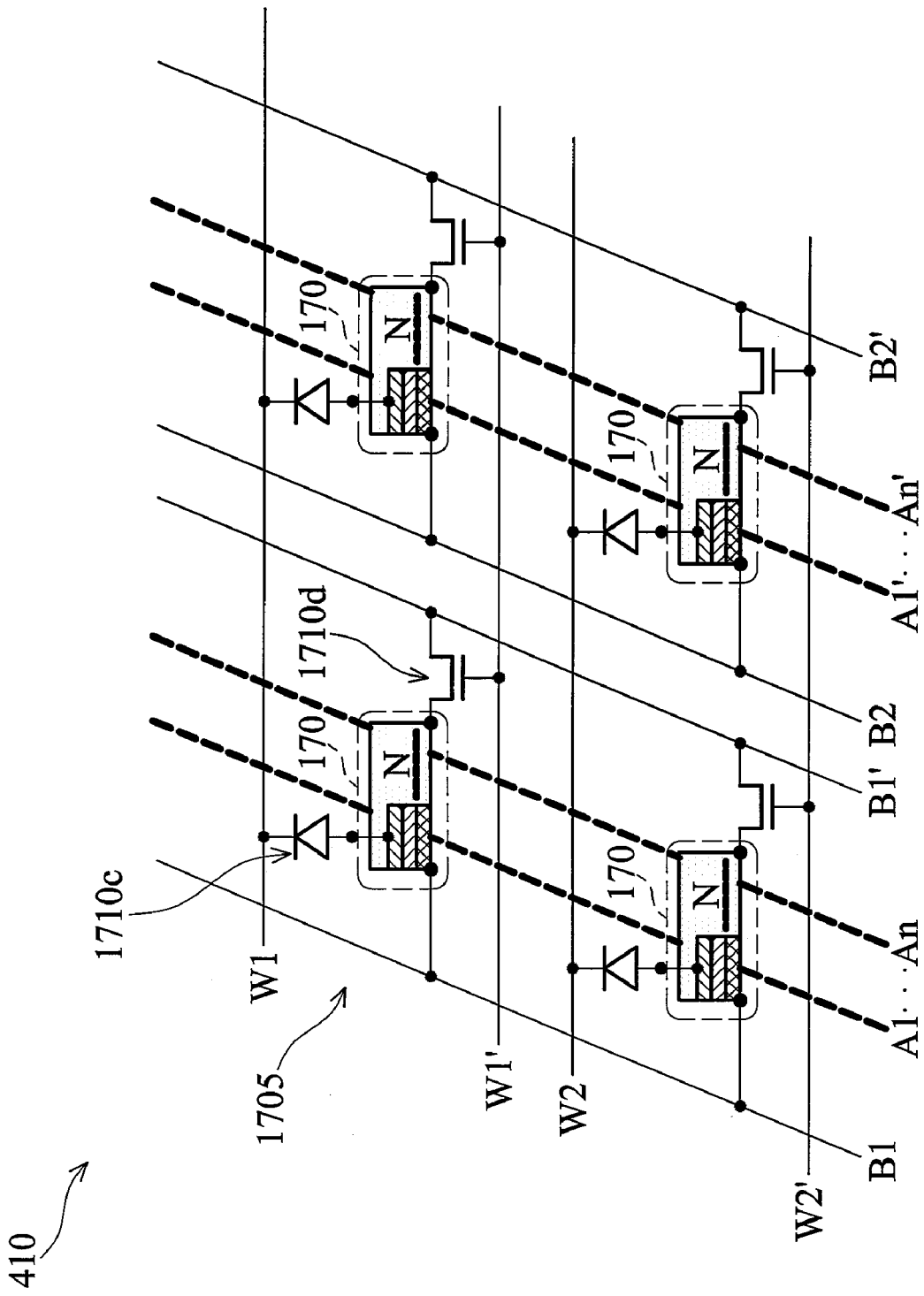

The array 410 in FIG. 11 includes bit lines B1, B2, word lines W1, W2, W1', W2', and conductive lines A1-An, A1'-An', among others. The array 410 also includes segmented units 170 each having a terminal connected to one of a word line and a word-bar line through a switch, another terminal connected to one of a bit line and a bit-bar line, and another terminal connected to the other of the bit line and bit-bar line through another switch. Several of the switches in the array 410 may be diodes or BJTs instead of (or in addition to) transistors. For example, a cell 1705 in the array 410 may include a segmented unit 170 having a terminal connected to word line W1 through a switch 1710c, wherein the switch 1710c may be or comprise a diode or BJT. Another terminal of the segmented unit 170 in cell 1705 may be connected to bit line B1. Another terminal of the segmented unit 170 in cell 1705 may be connected to bit-bar line B1' through another switch 1710d, wherein the switch 1710d may be a transistor having a gate that may be connected to word-bar line W1'.

Figure 12:
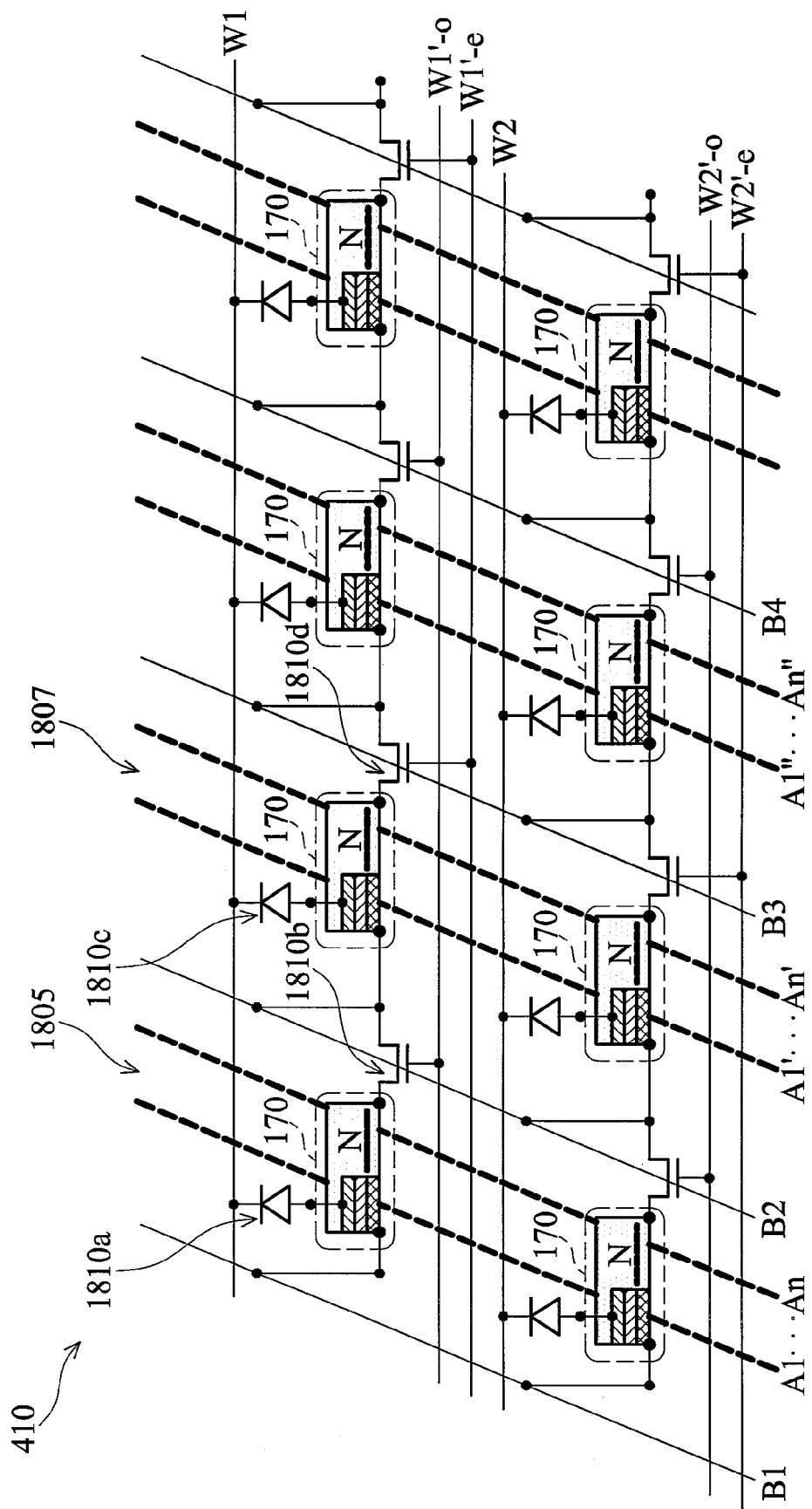

The array 410 in FIG. 12 includes bit lines B1, B2, word lines W1, W2, and conductive lines A1-An, A1'-An'. However, the array 410 also includes bit lines B3, B4, word-bar lines W1'-o, W1'-e, W2'-o, W2'-e, conductive lines A1"-An", among others. Thus, for each word line (e.g., W1), the array 410 may comprise two word-bar lines (e.g., W1'-o, W1'-e). For example, word-bar line W1'-o may be employed with odd-numbered ones of the cells which also employ word line W1, and word-bar line W1'-e may be employed with even-numbered ones of the cells that also employ word line W1. However, the cells that employ a word line may not be evenly distributed between corresponding word-bar lines, such that the even distribution (e.g., 50% of each) depicted in FIG. 18 may not be required. Moreover, more than two word-bar lines (e.g., W1'-1, W1'-2, W1'-3) may be employed with each corresponding word line.

The array 410 also includes segmented units 170 each having a terminal connected to one of a word line and a word-bar line through a switch, another terminal connected to a bit line, and another terminal connected to another bit line through another switch. Several of the switches in the array 410 may be diodes or BJTs instead of (or in addition to) transistors. For example, a cell 1805 in the array 410 may include a segmented unit 170 having a terminal connected to word line W1 through a switch 1810a, wherein the switch 1810a may be or comprise a diode or BJT. Another terminal of the segmented unit 170 in cell 1805 may be connected to bit line B1, and another terminal of the segmented unit 170 in cell 1805 may be connected to bit line B2 through another switch 1810b, wherein the switch 1810b may be a transistor having a gate that may be connected to word-bar line W1'-o. Another cell 1807 in the array 410 may include a segmented unit 170 having a terminal connected to word line W1 through a switch 1810c, wherein the switch 1810c may be or comprise a diode or BJT. Another terminal of the segmented unit 170 in cell 1807 may be connected to bit line B2. Another terminal of the segmented unit 170 in cell 1807 may be connected to bit line B3 through another switch 1810d, wherein the switch 1810d may be a transistor having; a gate that may be connected to word-bar line W1'-e.

Figure 13:
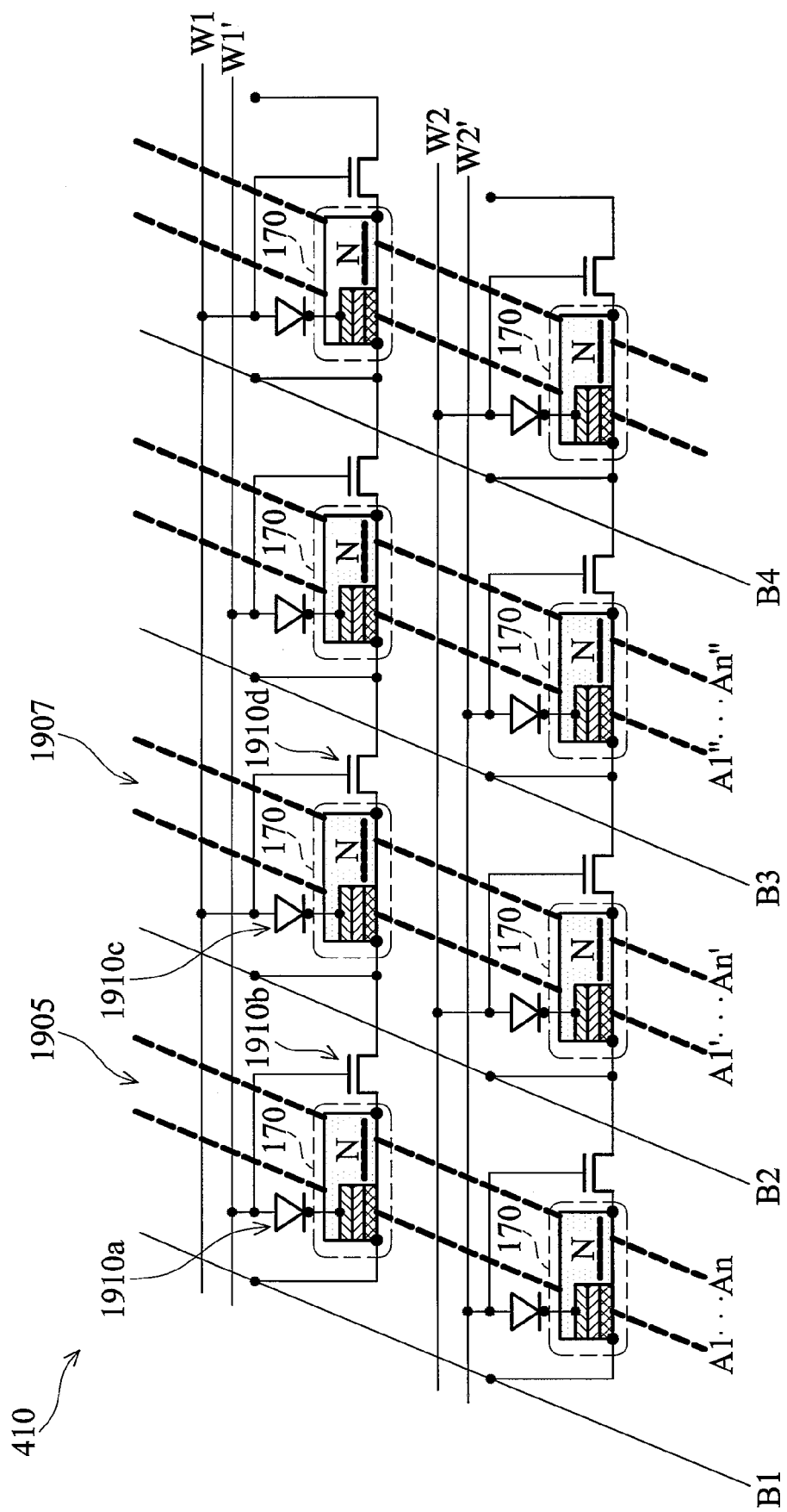

The array 410 in FIG. 13 includes bit lines B1, B2, word lines W1, W1', W2, W2', and conductive lines A1-An, A1'-An'. However, the array 410 also includes bit lines B3, B4 and conductive lines A1"-An", among others. The array 410 also includes segmented units 170 each having a terminal connected to one of a word line and a word-bar line through a switch, another terminal connected to a bit line, and another terminal connected to another bit line through another switch. Several of the switches in the array 410 may be diodes or BJTs instead of (or in addition to) transistors. Portions of several of the switches in the array 410 may also be connected. For example, a cell 1905 in the array 410 may include a segmented unit 170 having a terminal connected to word-bar line W1' through a switch 1910a, wherein the switch 1910a may be or comprise a diode or BJT. Another terminal of the segmented unit 170 in cell 1905 may be connected to bit line B1. Another terminal of the segmented unit 170 in cell 1905 may be connected to bit line B2 through another switch 1910b, wherein the switch 1910b may be a transistor having a gate that may be connected to the switch 1910a opposite the MTJ stacks of the segmented unit 170. Another cell 1907 in the array 410 may include a segmented unit 170 having a terminal connected to word line W1 through a switch 1910c, wherein the switch 1910c may be or comprise a diode or BJT. Another terminal of the segmented unit 170 in cell 1907 may be connected to bit line B2. Another terminal of the segmented unit 170 in cell 1907 may be connected to bit line B3 through another switch 1910d, wherein the switch 1910d may be a transistor having a gate that may be connected to the switch 1910c opposite the MTJ stacks of the segmented unit 170.

Thus, the above embodiments provide various MRAM arrays including, among other elements, a plurality of segment units and a plurality of conductive lines. Each of the plurality of segment units includes a number N of MTJ stacks electrically connected in parallel, wherein N is an integer greater than one. Such embodiments of MRAM arrays can include a plurality of segment units that, in addition to the above-described MTJ stacks, include two switches electrically connected to the MTJ stack. One or both of the switches may be a transistor and/or a diode or BJT. However, in the following embodiments, the disclosed MRAM arrays employ only one switching device for a plurality of MTJ stacks.

Exemplary High-Density Memory Array Layouts

Figure 14:
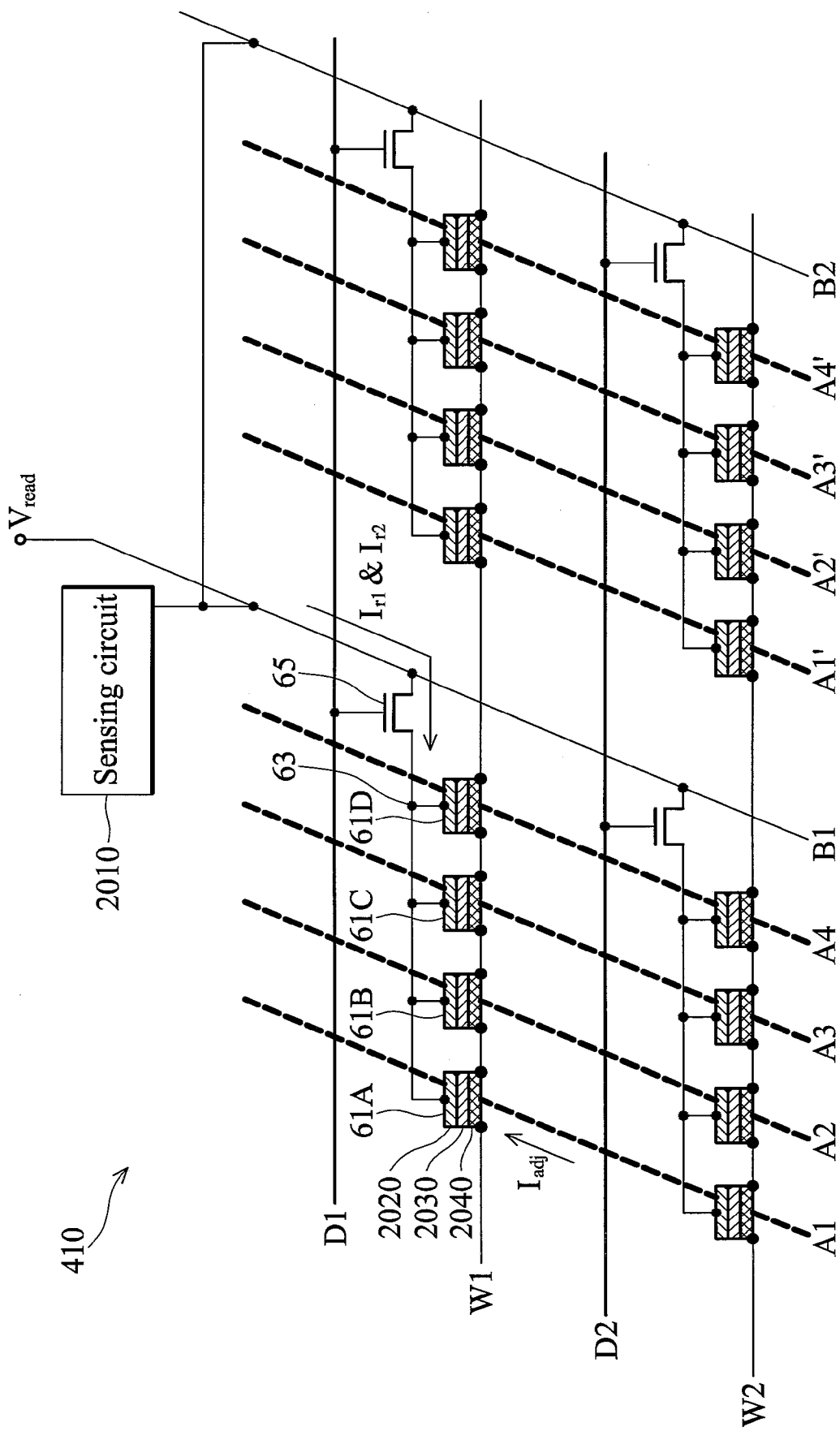
FIGS. 14 through 17 illustrate exemplary embodiments of high-density MRAM memory array layouts that be employed in the high-density array of a memory chip constructed as disclosed herein.

The MRAM array 410 in FIG. 14 comprises data lines D1 and D2, bit lines B1 and B2, and word lines W1 and W2. MTJ memory devices 61A, 61B, 61C, and 61D are connected in parallel between node 63 and word line W1. The NMOS transistor of switch 65, for example, is connected between bit line B1 and the node 63, and controlled by a selection signal provided by data line D1. The four MTJ memory devices 61A to 61D are each allocated to the node 63. Instead of four MTJ memory devices, two or three memory devices, or more than four memory devices, can also be assigned to one node. Programming lines A1, A2, A3, and A4 are located near the corresponding MTJ memory devices 61A, 61B, 61C, and 61D, respectively. In addition, a sensing circuit 2010 detects the current flowing through bit lines B1 and B2 when performing a read operation.

Figure 15:
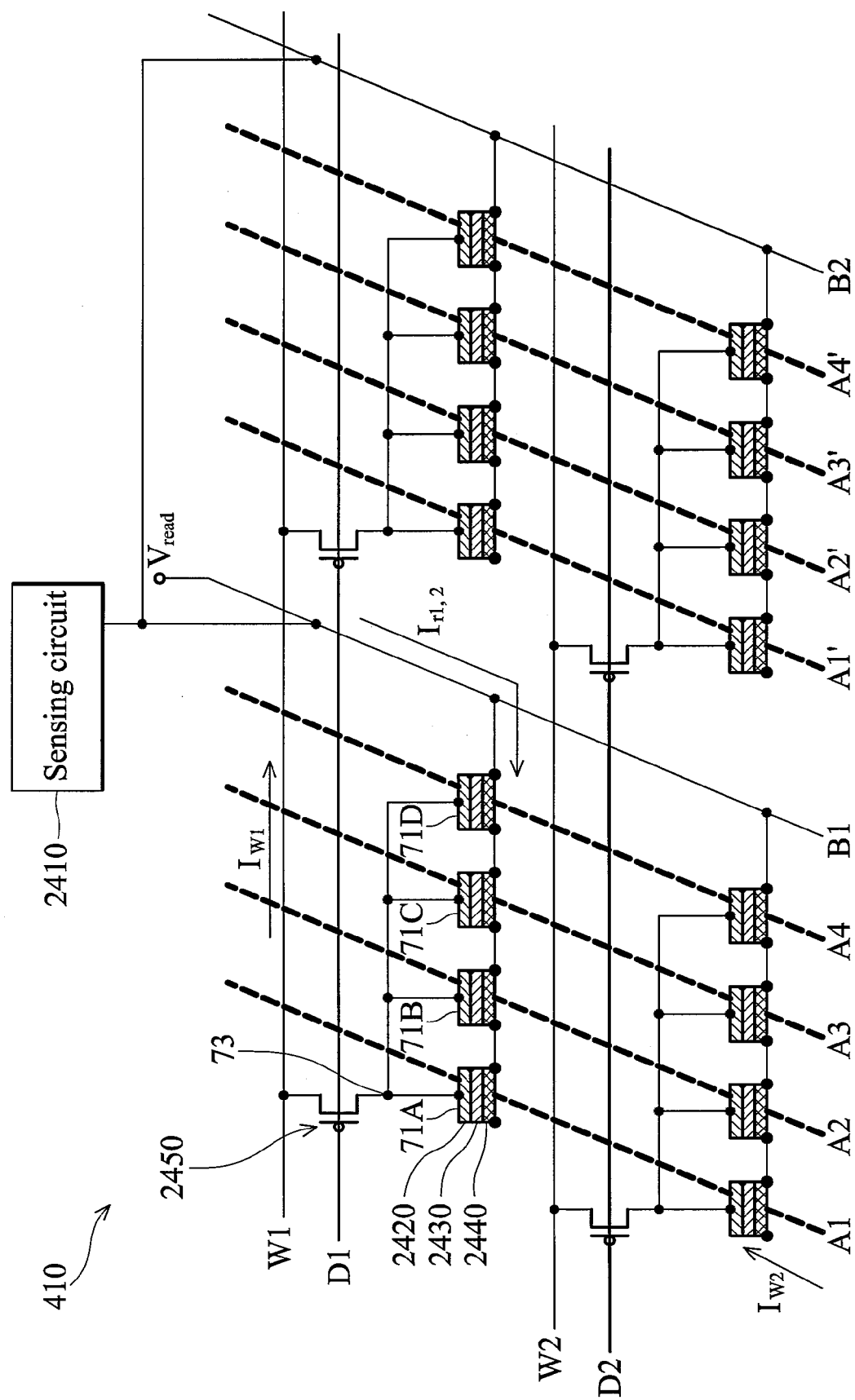

The MRAM array circuit 410 in FIG. 15 comprises data lines D1 and D2, bit lines B1 and B2, and word lines W1 and W2. MTJ memory devices 71A, 71B, 71C, and 71D are connected in parallel between node 73 and bit line B. Switch 2450, an NMOS transistor in this example, is connected between word line W1 and the node 73, and is controlled by a selection signal provided by data line D1. The four MTJ memory devices 71A-71D are each allocated to the node 73. Instead of four MTJ memory devices, two or three memory devices, or more than four memory devices, can also be assigned to one node. Programming lines A1, A2, A3, and A4 are located near the corresponding MTJ memory devices 71A, 71B, 71C, and 71D, respectively. In addition, a sensing circuit 2410 detects the current flowing through bit lines B1 and B2.

Figure 16:
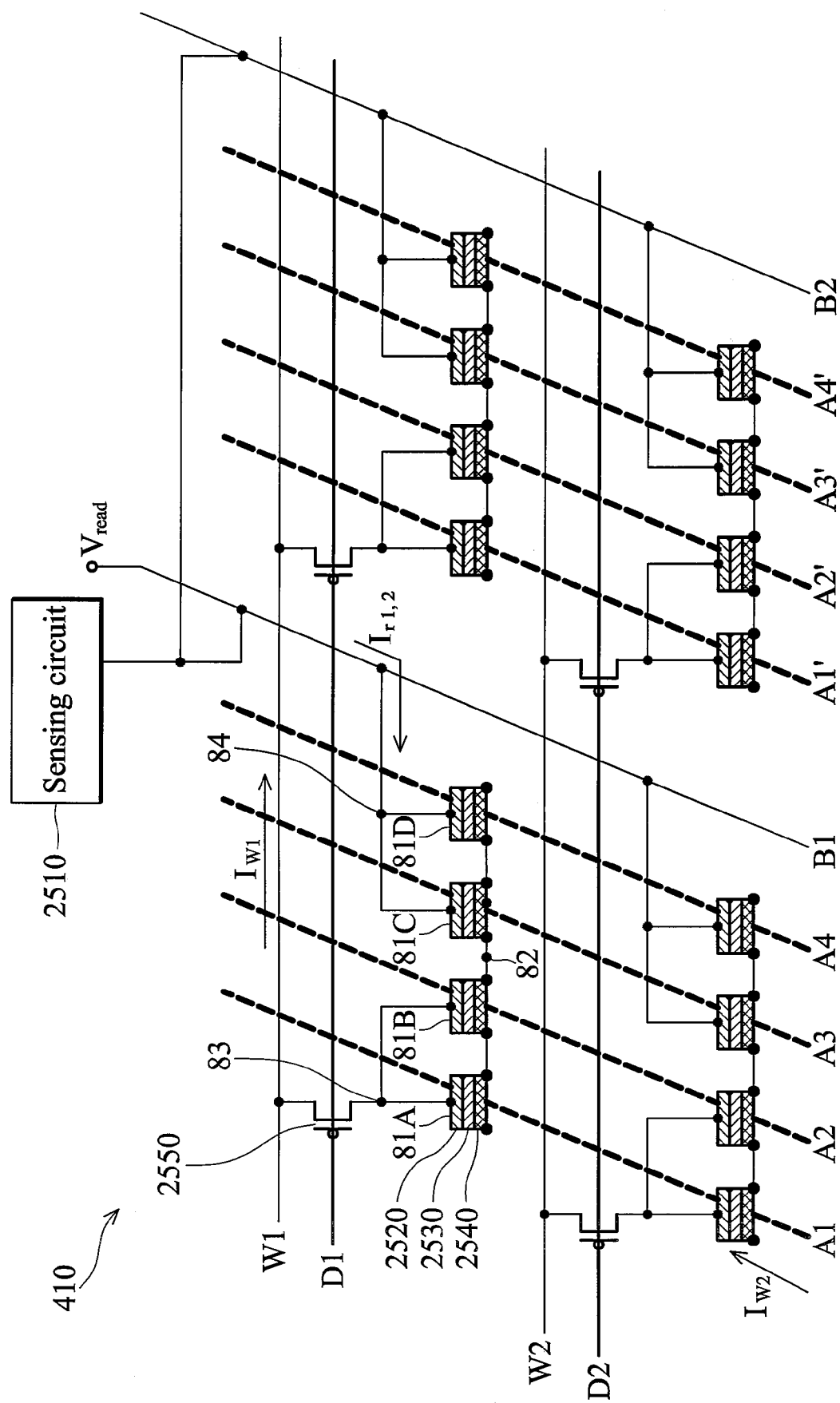
Figure 17:
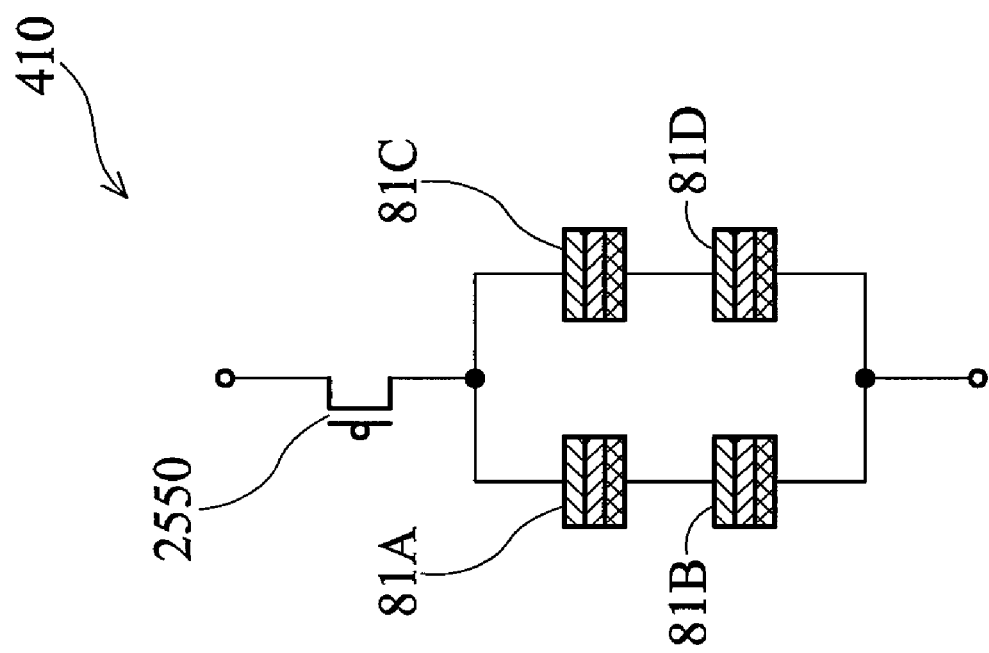

The MRAM array circuit 410 in FIG. 16 comprises data lines D1 and D2, bit lines B1 and B2, and word lines W1 and W2. MTJ memory devices 81A, and 81B are connected in parallel between nodes 82 and 83, MTJ memory devices 81C, and 81D are connected in parallel between node 82 and bit line B1. Here, the MTJ memory devices connected in parallel comprise a MTJ memory device group, and the MTJ memory device groups are connected in serial. For example, MTJ memory devices 81A and 81B comprise a first MTJ memory device group, MTJ memory devices 81C and 81D comprise a second MTJ memory device group, and the first and second MTJ memory device groups are connected in serial.

In another embodiment, MTJ memory devices 81A and 81B are connected serially and comprise a first MTJ memory device group; MTJ memory devices 81C and 81D are connected serially and comprise a second MTJ memory device group; and the first and second MTJ memory device groups are connected in parallel, as shown in the MRAM array 410 of FIG. 17. Even in such alternative embodiments, the connections of other signal lines, such as data line D1, bit line B1, word line W1, and programming lines A1~A4 are similar to those shown in FIG. 16.

In FIG. 16, the two MTJ memory devices 81A and 81B are each allocated to the node 83, and the two MTJ memory devices 81C and 81D are each allocated to the node 82. Instead of these two MTJ memory devices, more than two memory devices can also belong to one MTJ memory device group. Switch 2550, an NMOS transistor in this example, is connected between word line W1 and the node 83, controlled by a selection signal provided by data line D1. Programming lines A1, A2, A3, and A4 are located near the corresponding MTJ memory devices 81A, 81B, 81C, and 81D, respectively. In addition, a sensing circuit 2510 detects the current flowing through bit lines B1 and B2.

While various embodiments of the disclosed principles have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. An integrated circuit memory chip, comprising:
   a first memory cell array comprising an array of high-speed magnetic memory cells, which each comprise at least one switching device for one magnetoresistive stack;
   a second memory cell array adjacent to the first memory cell array, the second memory cell array comprising an array of high-density magnetic memory cells, which each comprise only one switching device per at least two magnetoresistive stacks;
   first array logic dedicated only for use with operation of the magnetic memory cells in the first memory cell array;
   second array logic dedicated only for use with operation of the magnetic memory cells in the second memory cell array;
   a first set of conductive lines interfacing the first array logic with the first memory cell array; and
   a second set of conductive lines interfacing the second array logic with the second memory cell array.

2. A memory chip according to claim 1, wherein the first set of conductive lines and the second set of conductive lines each comprise at least bit lines, word lines, and program lines.

3. A memory chip according to claim 1, wherein the first set of conductive lines and the second set of conductive lines share at least one type of conductive line.

4. A memory chip according to claim 1, wherein each of the high-speed magnetic memory cells comprises at least two switching devices coupled to opposing ends of a plurality of magnetoresistive stacks, the plurality of magnetoresistive stacks parallel-coupled together between the switching devices.

5. A memory chip according to claim 1, wherein magnetoresistive stacks comprised in the high-speed magnetic memory cells and the high-density magnetic memory cells comprise magnetic tunneling junction stacks.

6. A memory chip according to claim 1, wherein the only one switching device in the high-density magnetic memory cells comprises a semiconductor transistor.

7. A memory chip according to claim 1, wherein the at least one switching device in the high-speed magnetic memory cells comprises a semiconductor transistor.

8. A memory chip according to claim 1, wherein the high-speed memory cells comprise 2T1R memory cells.

9. A memory chip according to claim 1, wherein the high-density memory cells comprise 1T4R memory cells.

* * * * *